United States Patent [19]

Takagi et al.

[11] Patent Number: 4,562,424
[45] Date of Patent: Dec. 31, 1985

[54] CIRCUIT FOR INTEGRATING ANALOG SIGNAL AND CONVERTING IT INTO DIGITAL SIGNAL

[75] Inventors: Katsuaki Takagi, Hachioji; Yuzo Kita, Fuchu; Yoshimune Hagiwara, Kodaira; Shuichi Torii, Higashiyamato; Kazuyoshi Ogawa, Kodaira, all of Japan

[73] Assignees: Hitachi, Ltd.; Hitachi Microcomputer Engineering Ltd., both of Tokyo, Japan

[21] Appl. No.: 517,398

[22] Filed: Jul. 26, 1983

[30] Foreign Application Priority Data

Jul. 28, 1982 [JP] Japan ............................. 57-130337

[51] Int. Cl.$^4$ ........................................... H03K 13/02
[52] U.S. Cl. ..................... 340/347 NT; 340/347 AD; 307/260
[58] Field of Search ................ 340/347 NT, 347 AD; 307/260; 324/99 D

[56] References Cited

U.S. PATENT DOCUMENTS

| | | | |
|---|---|---|---|
| Re. 28,706 | 2/1976 | Dorey | 340/347 NT |
| 3,585,634 | 6/1971 | Sharples | 340/347 NT |
| 3,999,123 | 12/1976 | Thoener | 340/347 NT |
| 4,034,364 | 7/1977 | Fukuda | 340/347 NT |
| 4,057,796 | 11/1977 | Hoogendoorn | 340/347 NT |
| 4,180,807 | 12/1979 | Eichelberger et al. | 340/347 NT |

Primary Examiner—B. Dobeck
Attorney, Agent, or Firm—Antonelli, Terry & Wands

[57] ABSTRACT

An integrator circuit comprising reset means by which, when it is detected that an integrator output $V_p$ for an input analog signal coincides with a plus or minus reference value, the integral output is reset to the vicinity of the middle of the plus and minus reference values, in effect, without interrupting the integrating operation; a circuit which produces a pulse each time coincidence is detected; and a circuit which produces a direction signal indicating whether the coincidence results from an increase or a decrease of the integral input.

The pulses produced in the state in which the direction signal is indicating an increase are counted up, and the pulses produced in the state in which the direction signal is indicating a decrease are counted down, whereby the precise integral value of the input analog signal can be detected.

7 Claims, 14 Drawing Figures

FLOATING PERIOD

CIRCUIT FOR INTEGRATING ANALOG SIGNAL AND CONVERTING IT INTO DIGITAL SIGNAL

BACKGROUND OF THE INVENTION

The present invention relates to a circuit for converting the integral value of an analog signal into a digital signal.

An electronic type electric energy meter for three-phase alternating current is disclosed in 'INT. J. Electronics' 1980, vol. 48, No. 3, p. 257. By altering and improving this technique for single-phase use, some of the inventors of the present invention have proposed an electric power meter which is shown in FIG. 1 and which has been applied for a Japanese patent (Application No. 57-130301). This electric power meter produces a frequency signal $f_0$ in such a way that a voltage signal $E_v$ proportional to a feeder line voltage and a voltage signal $E_i$ proportional to a feeder line current are multiplied and then integrated. Accordingly, electric energy can be obtained by counting the frequency $f_0$.

The operations of this circuit will be described with reference to a time chart in FIG. 2.

This figure illustrates a case where the phase difference between the voltage and the current is 0°.

An integrator INT1, comparators CP1, CP2, a flip-flop FF1 and a switch SW1 serve to generate a triangular wave output $V_\Delta$. The integrator INT1 is composed of an operational amplifier A1, a resistor R1 and a capacitor C1, and it produces the integral output $V_\Delta$ of a voltage $V_B$ or $-V_B$ applied thereto through the switch SW1. For example, when the integrator is supplied with the voltage $V_B$, it provides a voltage which decreases rectilinearly gradually. This output $V_\Delta$ is applied to the noninverting input end of the comparator CP1 and the inverting input end of the comparator CP2. The inverting input end of the comparator CP1 and the noninverting input end of the comparator CP2 are respectively supplied with reference voltages $V_R$ and $-V_R$. The comparator CP1 delivers a pulse for setting the flip-flop FF1 each time the output $V_\Delta$ equalizes to $V_R$, while the comparator CP2 delivers a pulse for resetting the flip-flop FF1 each time the output $V_\Delta$ equalizes $-V_R$. The switch SW1 connects the voltage $V_B$ to the resistor R1 when the output Q of the flip-flop FF1 is "1", and it connects the voltage $-V_B$ to the resistor R1 when the output Q is "0". For example, when the switch SW1 is set on the voltage $V_B$ side, the output $V_\Delta$ of the integrator INT1 decreases rectilinearly gradually, and upon detection of the coincidence thereof in the comparator CP2, the flip-flop FF2 is reset, so that the switch SW1 is changed-over to the $-V_B$ side by the "0" output of the flip-flop. As a result, the integral output $V_\Delta$ begins to increase rectilinearly, and when it has coincided with $+V_R$, the flip-flop FF1 is set by the comparator CP1. In this manner, the output $V_\Delta$ becomes the triangular wave which oscillates between $\pm V_R$ at a fixed period. This voltage $V_\Delta$ and the signal of the voltage to-be-measured $E_v$ are respectively applied to the noninverting input terminal and inverting input terminal of a comparator CP3. The output $V_g$ of this comparator is a pulse whose width has been modulated in correspondence with the amplitude and phase of the signal $E_v$. To this end, the frequency of the triangular wave $V_\Delta$ is rendered sufficiently higher than that of the voltage $E_v$.

When the duty ratio D of the voltage $V_g$ is defined to be the proportion of a time for which the voltage $V_g$ becomes a "high" level within one cycle period of the triangular wave $V_\Delta$, it becomes:

$$D = \tfrac{1}{2}(1 - E_v/V_R) \qquad (1)$$

That is, D=50% holds at $E_v=0$ V, and $E_v<0$ for D>0 and $E_v>0$ for D<0 hold.

This output $V_g$ is used for controlling a switch SW2 through an exclusive OR gate (E-OR gate) EOR. The switch SW2 applies the signal of the current to-be-measured $E_i$ and the inverted signal thereof $-E_i$ to an integrator INT2 while changing-over them. The integrator INT2, comparators CP4, CP5 and a flip-flop FF2 are connected similarly to the integrator INT1, comparators CP1, CP2 and flip-flop FF1 mentioned above, respectively. In order to fold back the integral waveform $V_p$ of the integrator INT2 within the operating range $(+V_R - -V_R)$ thereof, the output $S_v$ of the flip-flop FF2 is applied to the E-OR gate EOR so as to invert the voltage $V_g$. Accordingly, when the signal $S_v$ is "0", the output of the gate EOR becomes a pulse whose width has been modulated in correspondence with the signal $E_v$, and when the signal $S_v$ is "1", it becomes a pulse whose width has been modulated in correspondence with the inverted signal of the signal $E_v$.

The flip-flop FF2 is set or reset by the output of the comparator CP4 or CP5 which is provided when the output $V_p$ of the integrator INT2 has exceeded the range of $\pm V_R$. At this time, the output $S_v$ becomes its "high" or "low" level. Assuming that the outputs of the CP4 and CP5 are alternately provided without fail (this holds when the phase difference between the voltage and the current is 0), the duty ratio $D_I$ between the voltage $V_g$ and the EOR output $S_I$ of the voltage $S_v$ takes the value of $D_I = D$ or $D_I = 1 - D$, depending upon whether the pulse $S_v$ is at the "low" level or "high" level. In case of allotting the value "0" to the output $S_v$ when it is at the "low" level and the value "1" thereto when it is at the "high" level, the duty ratio is expressed as $D_I = S_v + (1 - 2S_v)D$. When the switch SW2 is changed-over by the signal $S_I$ thus obtained, the output $\overline{V_M}$ of the switch SW2 is proportional to the product between the signals $E_v$ and $E_i$, as viewed on the average.

The average value $\overline{V_M}$ of the output $V_M$ within one cycle of the triangular wave $V_\Delta$ becomes:

$$\overline{V_M} = E_i \times D_I - E_i(1 - D_I)$$
$$= (2D_I - 1) E_i$$
$$= (1 - 2S_v)(2D - 1) E_i$$

Further, by substituting Formula (1), it becomes:

$$\overline{V_M} = (2S_v - 1) \cdot \frac{E_v E_i}{V_R} \qquad (2)$$

Since $(2S_v - 1)$ is $-1$ for $S_v = 0$ and is $+1$ for $S_v = 1$, Formula (2) becomes:

$$\overline{V_M} = \pm \frac{E_v \cdot E_i}{V_R} \qquad (3)$$

That is, the value $\overline{V_M}$ is proportional to the instantaneous voltages, and its sign changes between plus and minus, depending upon the signal $S_v$.

$V_p$ is the integral of $\overline{V_M}$, and is given by:

$$V_p = \frac{(1-2S_v)}{C_2 R_2} \int \left( \frac{E_v E_i}{V_R} \right) dt + V_{po} \quad (4)$$

where $V_{po}$ denotes the initial value of the integration.

It is detected by the comparators CP4 and CP5 that $V_p$ has reached $\pm V_R$, with the result that the status of the flip-flop FF2 changes. When the number of times which the output $S_v$ of the flip-flop FF2 has become "1" is counted for a certain period of time, a value proportional to electric energy can be obtained. For example, let's consider a time section from $t=0$ to $t=T$. Herein, the output $V_p$ changes between $\pm V_R$ with a waveform as shown in FIG. 2. $E_v \times E_i > 0$ is considered, and $V_{p0} = -V_R$ and $S_v = 0$ are supposed at $t=0$. Timings at which $V_p$ thereafter collides against $+V_R$ are denoted by $t_1, t_3, t_5 \ldots$ and $t_{2n-1}$, and timings at which it collides against $-V_R$ are denoted by $t_2, t_4 \ldots$ and $t_{2n}$. Then, in sections $t_{2i} - t_{2i+1}$, $S_v = 0$ holds, so that:

$$\Delta V_p = \frac{+1}{C_2 R_2} \int_{t_{2i}}^{t_{2i+1}} \frac{E_v E_i}{V_R} dt = 2 V_R \quad (5)$$

In addition, in sections $t_{2i+1} - t_{2i+2}$, $S_v = 1$ holds, so that:

$$\Delta V_p = \frac{-1}{C_2 R_2} \int_{t_{2i+1}}^{t_{2i+2}} \frac{E_v E_i}{V_R} dt = -2 V_R \quad (6)$$

Accordingly, the variation $V_T$ of the output voltage under the assumption that the integrator output is integrated continuously without folding it back becomes:

$$V_T \equiv \frac{1}{C_2 R_2} \int_0^T \frac{E_v E_i}{V_R} dt \quad (7)$$

$$= \frac{1}{C_2 R_2} \sum_{i=0}^{n-1} \left( \int_{t_{2i}}^{t_{2i+1}} \frac{E_v E_i}{V_R} dt + \int_{t_{2i+1}}^{t_{2i+2}} \frac{E_v E_i}{V_R} dt \right)$$

$$= 4 n V_R$$

On the other hand, the number of pulses of the output $S_v$ in this section is n. Accordingly, $$n = \frac{1}{4 C_2 R_2 V_R^2} \int_0^T E_v E_i \, dt \quad (8)$$

where $$\int_0^T E_v E_i \, dt$$

denotes the electric energy during the time interval T. Thus, the value obtained by counting the output $S_v$ is proportional to the electric energy.

A case where a phase difference has arisen between the voltage and the current in this circuit will now be considered in connection with an example in FIG. 3. Here, the phase difference is assumed $\theta = 45°$. Since the pulses $V_g$ and $V_M$ have been elucidated in FIG. 2, it is supposed here that $E_v \times E_i$ with the modulation waveform averaged is inputted to the integrator INT2. Then, a waveform as indicated at ⓐ in the figure can appear in the integrator output $V_p$. This is a phenomenon which can take place when $E_v \times E_i < 0$ has held, and which is attributed to the fact that an amplifier A2 is saturated, so the integrator fails to operate. When enlarged, this part is as shown in FIG. 4. Indicated by a broken line in the figure is the waveform $V_p'$ of the output $V_p$ in the case of assuming that the amplifier A2 is an ideal one which is not saturated. Even after the recovery of the amplifier from the saturation, the actual output $V_p$ does not become superposed on the waveform $V_p'$, and the difference develops as an error. The output of the operational amplifier can change to the vicinity of a supply voltage, but cannot exceed the supply voltage. Accordingly, when the input side is subjected to a condition under which the output exceeds the supply voltage range, the amplifier becomes saturated with its output fixed to the vicinity of the supply voltage and fails to effect the function as such. Since $\pm V_R$ are set inside the range of the supply voltages in FIG. 3, the output is fixed near the supply voltage as shown at ⓐ when the amplifier becomes saturated. The reason why the integrator becomes saturated in this manner, is as stated below. As the proper operation, the pulses of the comparators CP4 and CP5 ought to be alternately provided to invert the signal $S_v$ so as to fold back the output $V_p$. However, when the direction of the output $V_p$ reverses midway as shown in FIG. 3, the pulses of the comparator CP4 or CP5 are continuously provided, and hence, it becomes impossible to invert the signal $S_v$. This phenomenon is more noticeable as the phase difference is greater and as the time constant $C_2 \times R_2$ of the integrator INT2 is smaller.

In this manner, the circuit in FIG. 1 has the disadvantage that electric power having a phase difference cannot be precisely measured.

SUMMARY OF THE INVENTION

It is accordingly an object of the present invention to provide a circuit for integrating an analog signal and converting it into a digital signal, the circuit being adapted to produce the digital signal corresponding to the integral value of the analog signal which can assume any plus and minus values.

Another object of the present invention is to provide a circuit for integrating an analog signal and converting it into a digital signal, the circuit being adapted to produce the digital signal corresponding to the integral value of the two analog signals whose product can assume any plus or minus value.

Still another object of the present invention is to provide an integrator circuit with reset means which is used for attaining the objects.

The present invention comprises means by which when it is detected that an integrator output $V_p$ for an input analog signal has coincided with a plus or minus reference value, the integral output is reset to the vicinity of the middle of the plus and minus reference values, in effect, without interrupting an integrating operation; a circuit which produces a pulse each time the coincidence is detected; and a circuit which produces a direction signal indicating whether the coincidence results from the increase or decrease of the integral input.

The pulses produced in the state in which the direction signal is indicating the increase are counted up, and the pulses produced in the state in which the direction signal is indicating the decrease are counted down, whereby the precise integral value of the input analog signal can be detected.

DESCRIPTION OF THE PREFERRED EMBODIMENTS

Figure 1:
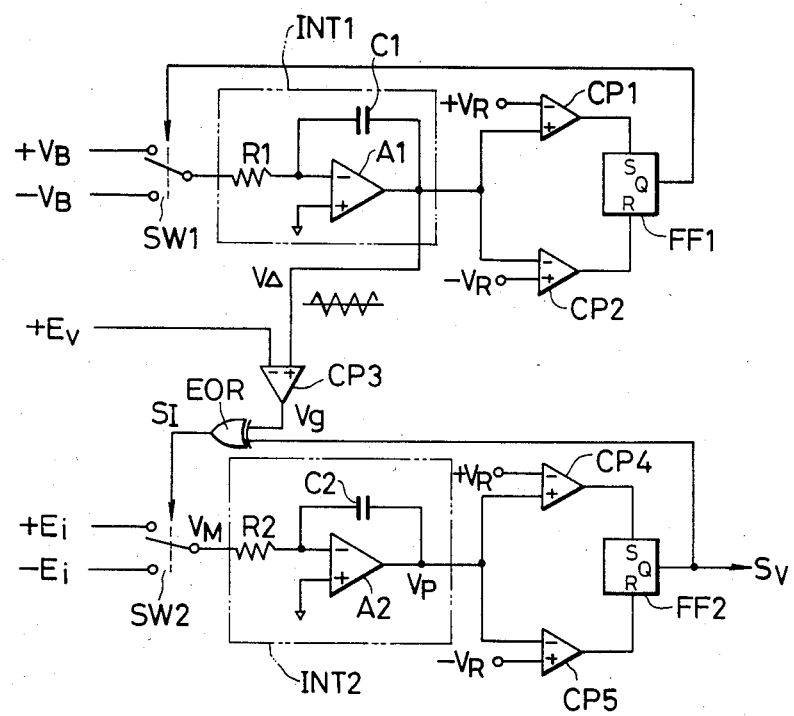
FIG. 1 is a circuit diagram of a circuit arrangement for integrating the product of analog signals, the circuit arrangement having been proposed by some of the inventors of the present invention.
Figure 2:
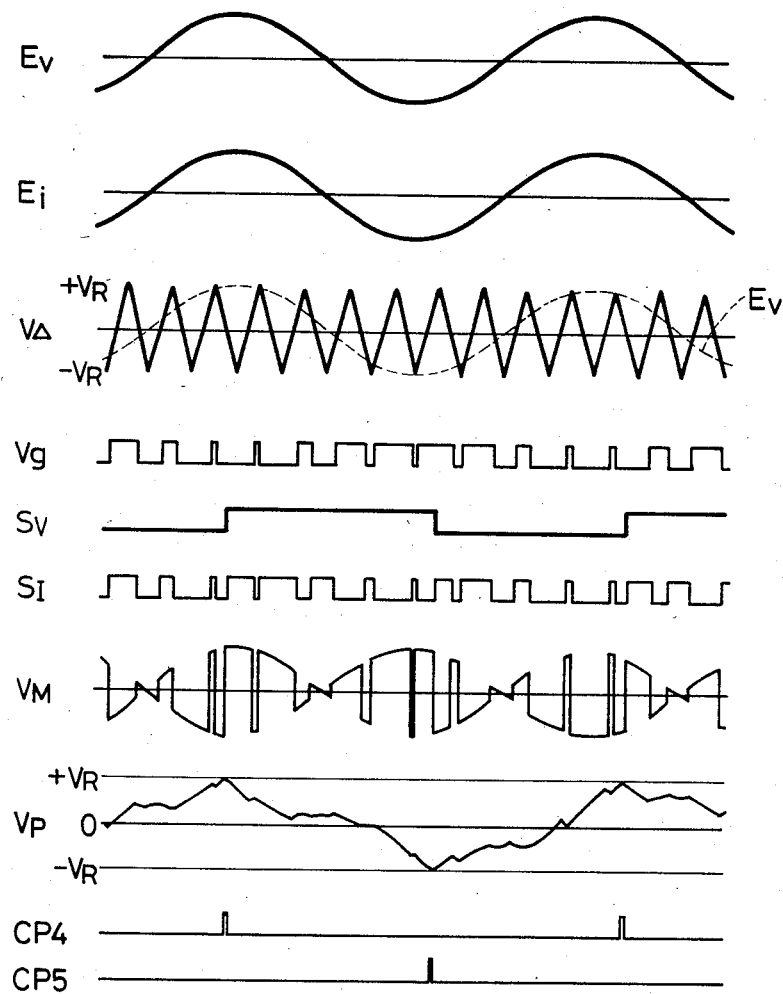
FIG. 2 is a time chart of the circuit arrangement in FIG. 1 in the case of using two A.C. signals with no phase difference.
Figure 3:
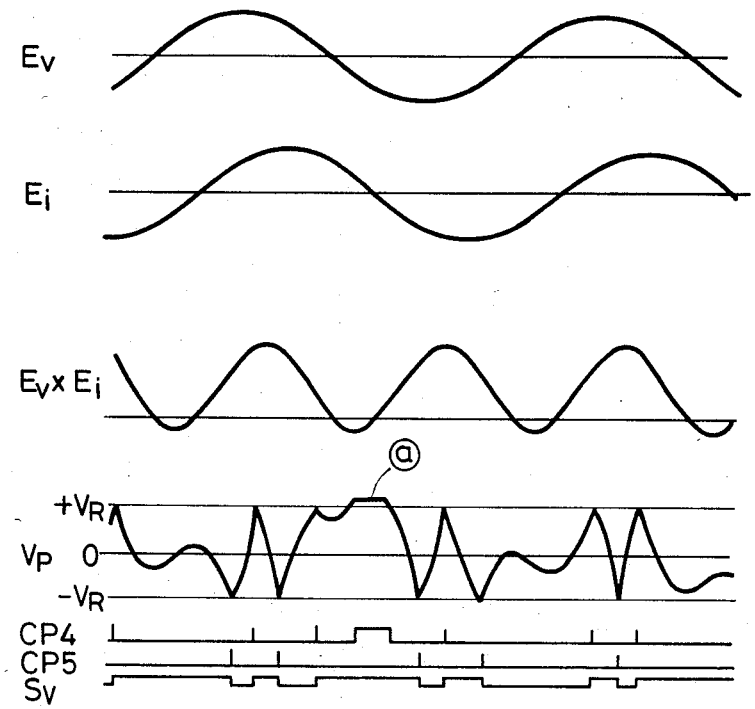
FIG. 3 is a time chart of the circuit arrangement in FIG. 1 in the case of using two A.C. signals with a phase difference.
Figure 4:
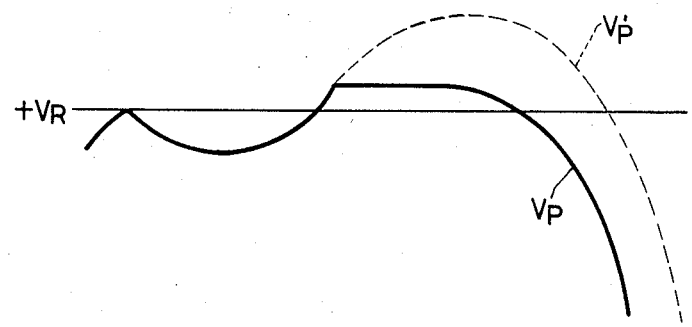
FIG. 4 is a diagram for explaining the saturation of an operational amplifier in the circuit arrangement of FIG. 1.
Figure 5:
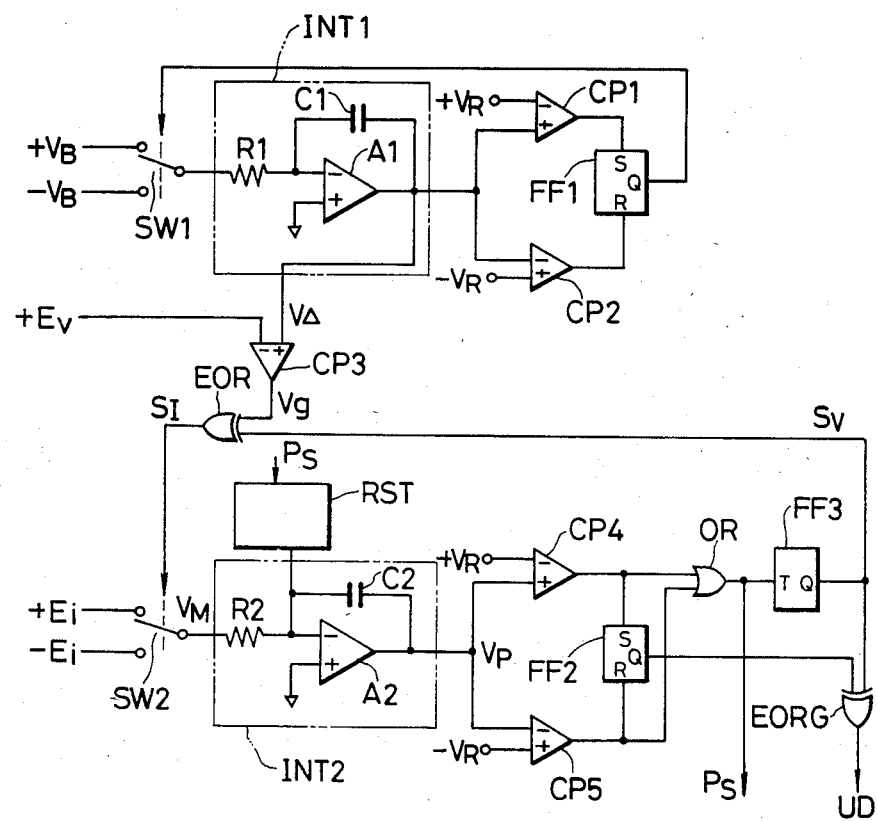
FIG. 5 shows an integrator circuit for the product of analog signals according to the present invention.

In FIG. 5, the same reference symbols as in FIG. 1 indicate the same parts. The points of difference from FIG. 1 are that a reset circuit RST is connected to the amplifier A2, that a toggle type flip-flop FF3 is triggered by the output pulse $P_s$ of an OR gate OR supplied with the outputs of the comparators CP4 and CP5 and has its output supplied as the input signal $S_v$ to the exclusive OR gate EOR, and that along with the output of the flip-flop FF3, the set output of the flip-flop FF2 is applied to an exclusive OR gate EORG, the output UD of which appoints the counting direction in which the pulse $P_s$ is counted up or down. As described later, the signal UD is "0" when the integral value $V_p$ is for plus electric power, and it is "1" when the integral value $V_p$ is for minus electric power. Accordingly, an external up/down counter (not shown) is so constructed as to count up or count down the pulse $P_s$, in accordance with the signal UD being "0" or "1". As a result, the count value of the up/down counter represents the net electric power.

Figure 6:
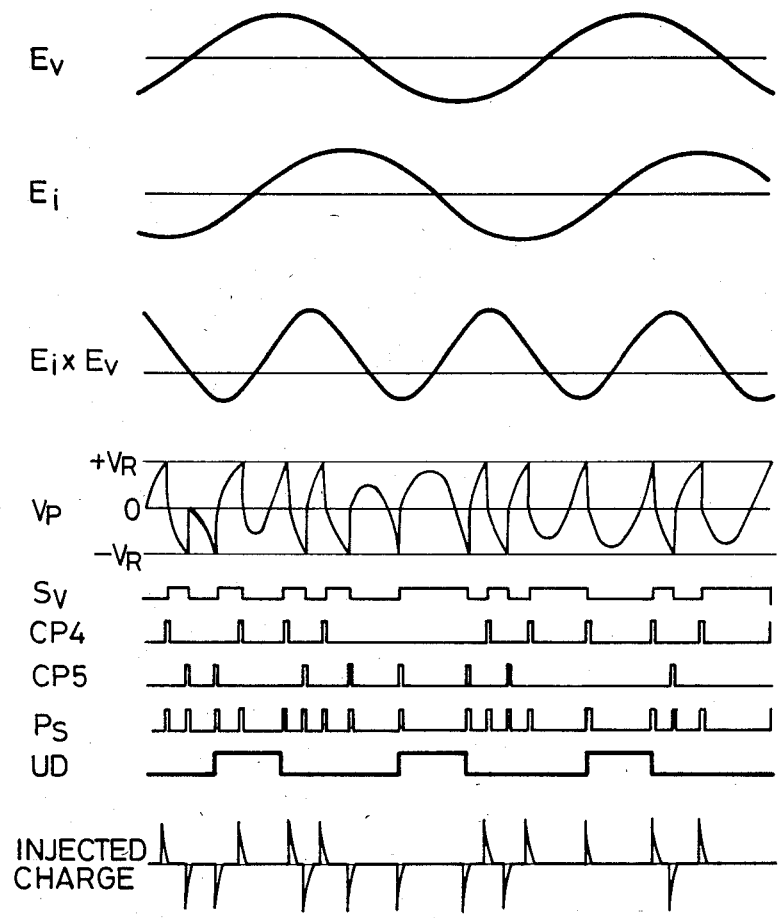
FIG. 6 is a time chart of the circuit arrangement in FIG. 5.

The reset circuit RST is a circuit which operates so as to bring the output $V_p$ near to zero when the output voltage $V_p$ of the integrator INT2 has reached $\pm V_R$ (the details will be described later). The operating waveforms of the circuit arrangement in FIG. 5 are shown in FIG. 6. FIG. 6 illustrates a case where the phase difference is $\theta = 67.5°$. Also in the present circuit arrangement, Formulas (1)–(4) hold as to the integrator input $V_M$ and the integrator output $V_p$. Here will be considered a case where $E_v \times E_i > 0$, namely, the condition of plus electric power has held. At this time, the signals UD and $S_v$ are "0". The signal $V_p$ goes positive with the lapse of time t. When $V_p = +V_R$ has been reached, the comparator CP5 provides a pulse. The flip-flop FF2 is set by this pulse (its output becomes "1"), and simultaneously inverts the status of the flip-flop FF3 through the OR gate OR, to render $S_v = 1$. As a result, while one pulse $P_s$ is provided from the OR gate OR, the direction indicating pulse UD remains intact at "0" in the status in which both the flip-flops FF2 and FF3 are reset. It can thus be specified that the pulse $P_s$ produced here ought to be counted up in correspondence with the plus electric power. Meantime, the reset circuit RST operates in response to the pulse $P_s$, and positive charges for putting the storage charges of a capacitor C2 into zero are injected into this capacitor, so that the voltage $V_p$ instantly falls to the vicinity of 0 V. Thereafter, the voltage $V_p$ goes negative because $S_v = 1$ holds. When $V_p = -V_R$ has been reached, the pulse of the comparator CP5 is provided. This pulse resets the flip-flop FF2 (its output is "0"), to reset the flip-flop FF3 and to render $S_v = 0$. At this time, the output UD of the exclusive OR gate EORG remains intact at "0". As a result, likewise to the above, one pulse $P_s$ is provided from the OR gate OR, and UD=0 is maintained to indicate that the pulse $P_s$ ought to be counted up as the plus electric power pulse. Herein, at the same time that the voltage $V_p$ has reached $-V_R$, negative charges for putting the storage charges of the capacitor C2 into zero are injected into this capacitor by the circuit RST, so that the voltage $V_p$ becomes 0 V. Subsequently, when $E_v \times E_i < 0$ has held, the voltage $V_p$ goes negative, and when it has coincided with the voltage $-V_R$, a pulse is provided from the comparator CP5. The flip-flop FF2 remains reset in the current example, but the flip-flop FF3 is inverted (its output becomes "1") simultaneously with the provision of the pulse $P_s$ from the OR gate OR. Needless to say, in a case where the flip-flop FF2 is set at the provision of the pulse from the comparator CP5, this flip-flop FF2 is reset. Thus, UD=1 is established to indicate that the pulse $P_s$ ought to be counted down as a minus electric power pulse. Simultaneously with the generation of the pulses $P_s$, negative charges are injected into the capacitor C2 by the circuit RST, so that the voltage $V_p$ becomes 0 V. Thereafter, the voltage $V_p$ goes positive because of $S_v = 1$, and when it has reached $V_R$, a pulse is provided from the comparator CP4, the flip-flop FF2 is set, the pulse $P_s$ is provided from the OR gate OR, and simultaneously, the flip-flop FF3 is inverted (the output $S_v$ becomes "0"). Thus, one pulse $P_s$ is provided from the OR gate OR, and the signal UD remains intact at "1", to indicate that the pulse $P_s$ ought to be counted down as the minus electric power pulse.

In this manner, in the present embodiment, when the integrator output $V_p$ has reached $+V_R$ or $-V_R$, the voltage $V_p$ is forcibly returned to the vicinity of 0 V by the charge injection. Thereafter, in the case where the signal $S_v$ is, e.g., "0", the voltage $V_p$ goes in the positive direction upon receiving the plus electric power and in the opposite direction upon receiving the minus electric power, and by utilizing this fact, the polarity of the electric power is decided from the value of the signal $S_v$ and which of the comparators CP4 and CP5 the pulse has been detected by. The integral output $V_p$ after the resetting need not always be "0", but may be a fixed value. Further, the fixed value may differ at the times when the integral output $V_p$ has coincided with the plus and minus reference values $V_R$ and $-V_R$, to be reset.

It is consequently possible to prevent the voltage $V_p$ from exceeding the range of $\pm V_R$ and the amplifier A2 from being saturated.

The simplest method for realizing the reset circuit RST is to dispose a switch $S_x$ for interrupting both the ends of the capacitor C2 in FIG. 5, so as to turn "on" the capacitor only when the pulse $P_s$ is "1". This method, however, has the following problem. Since the switch $S_x$ and wiring possess a resistance $R_x$, the reset period of time during which the switch is turned "on" needs to be several times longer than the time constant $C_2 \cdot R_x$. On the other hand, during the reset period of time, the integrator INT2 does not operate as such, and hence, the input signal during the interval cannot be integrated. The interruption of the integration develops as an error. According to the present invention, such interruption of the integration is substantially prevented.

Practicable examples of the reset circuit will now be described.

Figure 7:
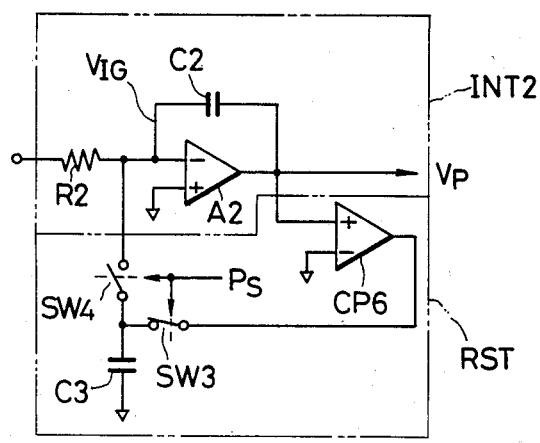
FIG. 7 shows a first embodiment of a reset circuit for use in the circuit arrangement of FIG. 5.

FIG. 7 shows the first embodiment of the reset circuit RST.

Figure 8:
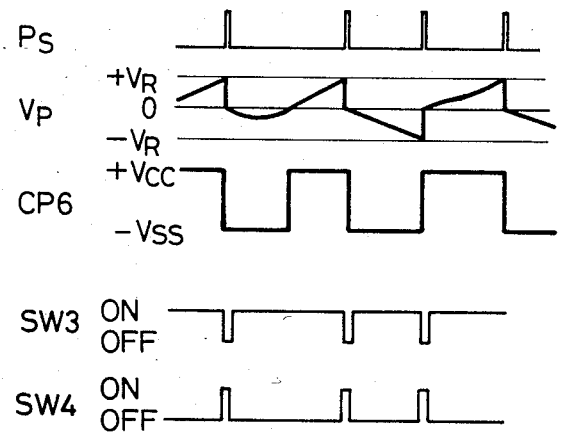
FIG. 8 is a time chart of the circuit arrangement in FIG. 7.

This reset circuit RST is constructed of a comparator CP6 whose plus input is the output $V_p$ of the integrator INT2 and whose minus input is the earth potential, a capacitor C3 one end of which is earthed, a switch SW3 which connects the other end of the capacitor C3 and the output of the comparator CP6, and a switch SW4 which connects the other end of the capacitor C3 and the minus input terminal of the amplifier A2 within the integrator INT2. The switches SW3 and SW4 are temporarily turned "off" and "on" by the pulse $P_s$ (FIG. 5), respectively. FIG. 8 shows a time chart of the operations of the reset circuit RST. When the integrator output $V_p$ lies within the range of $\pm V_R$, $P_s=$"0" holds. In this state, the switch SW3 is "on", and SW4 "off". The comparator CP6 operates so as to generate $+V_{cc}$ for $V_p>0$ and $-V_{ss}$ for $V_p<0$. Therefore, when $V_p>0$ holds by way of example, charges of $C_3 \times V_{cc}$ are stored in the capacitor C3. At the point of time at which the voltage $V_p$ has reached $+V_R$, charges of $-C_2 \times V_R$ are stored in the electrode of the capacitor C2 located on the minus input end side of the amplifier A2. In this state, the pulse $P_s=$"1" is established by the comparator CP4 shown in FIG. 5. This pulse turns "off" the switch SW3, and turns "on" SW4. As a result, a voltage $V_{IG}$ at the minus input end (virtual earth terminal) of the amplifier A2 fluctuates temporarily, but it settles to $V_{IG}=0$ again. At this time, the positive charges $C_3 \times V_{cc}$ of the capacitor C3 are all injected into the capacitor C2, and the output voltage is reset to $$V_p = V_R - \frac{C_3}{C_2} V_{cc}.$$

If $C_3$ or $V_{cc}$ is so set as to put $C_3 V_{cc} = C_2 V_R$, $V_p=0$ can be established. When $P_s=$"0" is held, the operational amplifier A2 operates as the integrator again, the switches SW3 and SW4 are respectively turned "on" and "off", and the capacitor C3 is charged by the comparator CP6. Such cycles are repeated. The above operations hold similarly for the case of $V_p<0$. In this case, $-V_{ss}$ is provided from the comparator CP6, and the negative charges of $-C_3 \times V_{ss}$ are stored in the capacitor C3. At the point of time at which $V_p=-V_R$ has been reached, the voltage of $C_2 \times V_R$ is stored in the capacitor C2. At this point of time, the pulse $P_s$ becomes "1", whereby the charges of the capacitor C3 are injected into the capacitor C2, and the output voltage $V_p$ becomes $$-V_R + \frac{C_3}{C_2} V_{ss}.$$

In this way, each time the voltage $V_p$ has reached $V_R$ or $-V_R$, the positive charges or negative charges are injected into the capacitor C2, and the charges of the capacitor C2 are put into zero.

In the present embodiment, the capacitor C3 and the comparator CP6 are required besides the integrating capacitor C2.

The integrating operation is disturbed during the period after the switch SW4 has turned "on" and before the input end voltage $V_{IG}$ of the amplifier A2 becomes 0 (zero). Since, however, the integrating operation by the integrating capacitor C2 is continuing even during this period, the error can be made smaller than in the case of resetting the integral output by short-circuiting the capacitor C2. In addition, after the voltage $V_{IG}$ has become zero, the terminal voltage of the capacitor C3 becomes the zero potential, and hence, the capacitor C3 exerts no influence on the integrating operation. Accordingly, even when the width of the pulse $P_s$ is great, no error is introduced, so that the design of the circuits for generating the pulse $P_s$ is easy, and the integrator and converter circuit is immune against fluctuations in an IC manufacturing process.

In the present embodiment, however, the control timings of the switches SW3 and SW4 need to be determined so that the switch SW4 may be turned "on" after the switch SW3 has been turned "off", and vice versa.

Figure 9:
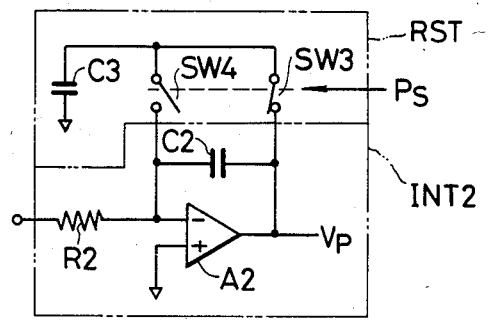
FIG. 9 shows a second embodiment of the reset circuit for use in the circuit arrangement of FIG. 5.

FIG. 9 shows the second embodiment of the reset circuit RST.

The circuit RST is constructed of a capacitor C3 one end of which is given the earth potential, and switches SW3 and SW4 which serve to connect the other end of the capacitor C3 to the respective electrodes of the capacitor C2 located on the output end side and input end side of the amplifier A2. As in the case of FIG. 7, the switches SW3 and SW4 are respectively turned "off" and "on" temporarily by the pulse $P_s$.

In the first embodiment, the voltage to be charged in the capacitor C3 is changed by the output of the comparator CP6, whereas in the second embodiment, the voltage $V_p$ is directly charged in the capacitor C3. The pulse $P_s$ becomes "1" at the instant at which the voltage $V_p$ has reached $+V_R$ or $-V_R$. Therefore, immediately before the pulse $P_s$ becomes "1", the switches SW3 and SW4 are "on" and "off" respectively, and the reference voltage $+V_R$ or $-V_R$ is charged in the capacitor C3. Accordingly, the switches SW3 and SW4 are respectively turned "off" and "on" when the pulse $P_s$ has thereafter become "1", whereby results equivalent to those of the first embodiment can be obtained. A further merit is that one comparator is dispensed with when the second embodiment is compared with the first embodiment.

Figure 10:
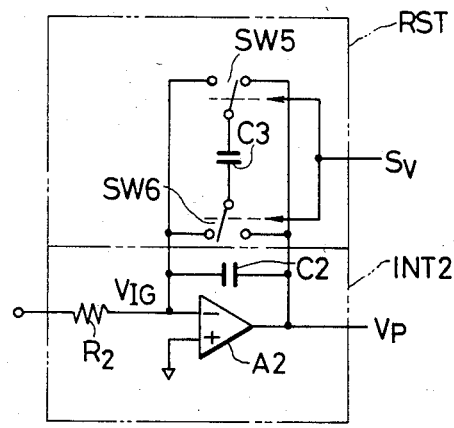
FIG. 10 shows a third embodiment of the reset circuit for use in the circuit arrangement of FIG. 5.

FIG. 10 shows the third embodiment. The reset circuit RST is constructed of a capacitor C3, and a pair of change-over switches SW5 and SW6 which serve to change-over the direction of connection between this capacitor C3 and the capacitor C2 of the integrator INT2. The switches SW5 and Sw6 are controlled so that, when the voltage $V_p$ has become $V_R$ or $-V_R$ with the capacitor C3 connected in parallel with the capacitor C2, the capacitor C3 may have its polarity inverted and be connected to the capacitor C2. In each of the first and second embodiments, the capacitor C3 has the significance of existence merely for the injection of charges. Since, however, the capacitors C2 and C3 have capacitances of several tens to several hundred pF, they occupy a considerable area (about 1-3 mm square) when fabricated on the chip of an LSI. Accordingly, the inclusion of any capacitor not contributing to the integration should better be avoided to the utmost. In the third embodiment, therefore, the capacitor C3 is also used as the integrating capacitor, and the terminals of the capacitor C3 are inverted the instant that the voltage $V_p$ has reached $\pm V_R$. Thus, $C_2+C_3$ can be used as the integrating capacitance, so that the increase of the chip area is not incurred.

In the third embodiment, the signal $S_v$ is used as the inverting signal for the connection of the capacitor C3. As stated before, the signal $S_v$ is inverted each time the integral output $V_p$ reaches $\pm V_R$. By inverting the polarity of the capacitor C3, the charges of the capacitor C2 and those of the capacitor C3 are neutralized. By way of example, when the time is considered at which the voltage $V_p$ has reached $+V_R$, charges of $Q_2=C_2 \cdot V_R$ are stored in the capacitor C2, and charges of $Q_3=C_3 \cdot V_R$ in the capacitor C3. Here, when the polarity of the capacitor C3 is inverted, the voltage of:

$$V_p=(C_2-C_3) \cdot V_R/(C_2+C_3)$$

arises as the voltage $V_p$. This lies within the range of $\pm V_R$. The quantity of charges injected in this case is $Q=2C_3 \cdot V_R$, and it is understood that the injection of a fixed quantity of charges has been executed. When $C_3=C_2$ is held, the voltage $V_p$ after the inversion of the capacitor C3 becomes zero, which is the most favorable. These apply to the case where $V_p$ has reached $-V_R$, quite similarly.

Figure 11:
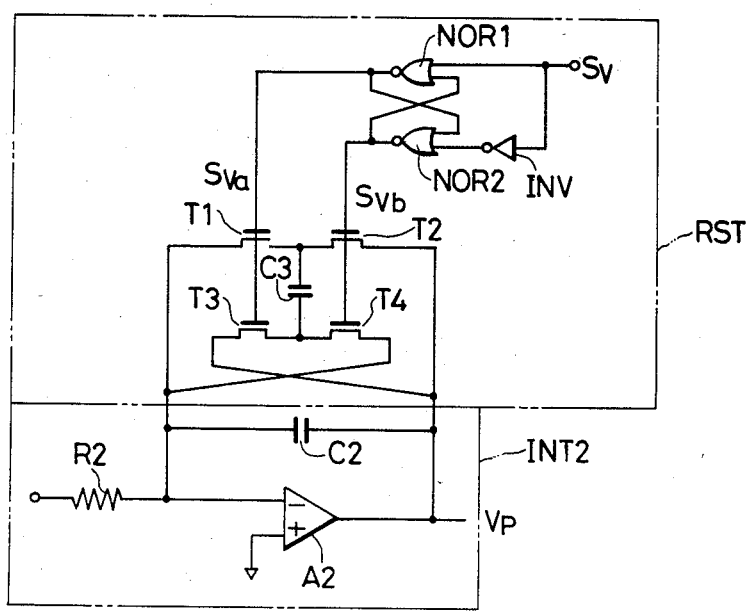
FIG. 11 shows a MOS transistor circuit which realizes the circuit arrangement in FIG. 10.
Figure 12:
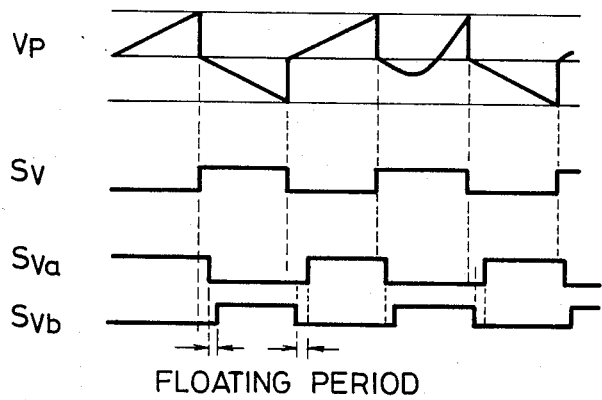
FIG. 12 is a time chart of the circuit arrangement in FIG. 11.

In realizing this circuit, when the switches SW5 and SW6 are changed-over, a floating state in which they are not connected with either terminal needs to be gone through. This is intended to prevent excess charges from being injected in such a manner that the charges stored in the capacitor C3 leak due to short-circuit or that the output end of the amplifier A2 is directly connected to the input end $V_{IG}$. FIG. 11 shows an example which has been realized by the use of logic gates and NMOS transistors in consideration of the above point. This circuit can be realized similarly with either CMOS FETs or PMOS FETs. A timing chart of the circuit is shown in FIG. 12.

The parallel connection of the capacitors C3 and C2 is effected by transistors T1–T4. The control of the "on" and "off" of these transistors is effected by a pair of cross-connected NOR gates NOR1, NOR2 and an inverter INV. In the state in which the signal $S_v$ is "0", signals $S_{va}$ and $S_{vb}$ are "1" and "0", respectively, so that the transistors T1 and T3 are "on" and those T2 and T4 "off". Accordingly, the upper and lower electrodes of the capacitor C3 as viewed in the figure are respectively connected to the left and right electrodes of the capacitor C2 as viewed in the figure. When, under this state, the signal $S_v$ has changed to "1", the signal $S_{va}$ changes to "0" with a delay equal to the switching time of the NOR gate NOR1. On the other hand, the signal $S_{vb}$ changes with a further delay equal to the switching time of the NOR gate NOR2 after the signal $S_{va}$ has changed and besides the output of the inverter INV has changed. When the signal $S_{vb}$ has become "1", the "on" and "off" states of the transistors T1–T4 are changed-over. However, for the period till the change of the signal $S_{vb}$ to "1" after the signal $S_{va}$ has become "0", both the signals $S_{va}$ and $S_{vb}$ are "0", and the state in which all the transistors T1–T4 are "off" (the floating state) is established. Likewise, after the signal $S_v$ has changed from "1" to "0", the floating state is established as shown in FIG. 12.

Even while the switches SW5 and SW6 are in the floating state in this manner, the capacitor C2 is held connected to the operational amplifier A2. Accordingly, the integrating operation is sustained during this period, and charges corresponding to the integral input are stored in the capacitor C2. At this time, the capacitor C3 is not connected, so that the output $V_p$ takes a value different from a normal value. However, when the capacitor C3 has been thereafter connected to the capacitor C2, the charges of the capacitor C2 flow also into the capacitor C3, so that the output $V_p$ becomes the normal value. Accordingly, the error due to the floating is not influential, and the floating time can be set with a certain degree of time margin.

The present embodiment is the same as the first embodiment in that when the capacitor C3 has had its polarity inverted and has been connected to the capacitor C2, the input terminal voltage $V_{IG}$ has a value different from zero transiently until the charges of the capacitors C2 and C3 become zero, so a negligible error develops in the output $V_p$.

In the LSI implementation, parasitic capacitances at both the ends of the capacitor C3 cannot always be equalized. When they are unequal, there arises the phenomenon that the quantity of charges to be injected into the minus input terminal side of the operational amplifier A2 by the resetting differs depending upon the polarity of the signal $S_v$, resulting in the change of the output voltage after the resetting. Since, however, this phenomenon does not lead to an error, it poses no problem in practical use.

Figure 13:
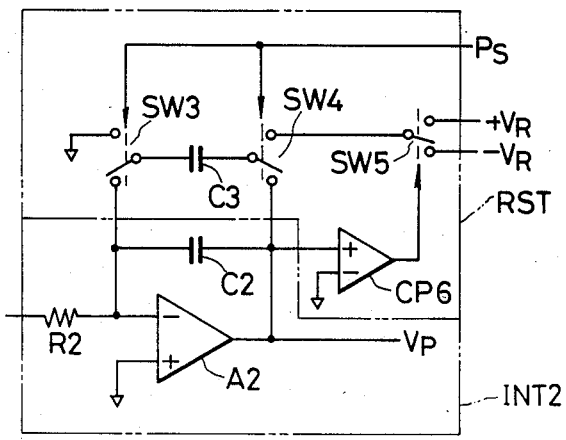
FIG. 13 shows a fourth embodiment of the reset circuit for use in the circuit arrangement of FIG. 5.

The fourth embodiment is shown in FIG. 13. The reset circuit RST is constructed of a capacitor C3, a change-over switch SW3 which connects one end of the capacitor C3 to either the ground potential or the inverting input of the integrator INT2, a change-over switch SW4 which connects the other end of the capacitor C3 to either the output side of the integrator INT2 or the common terminal of a change-over switch SW5, the change-over switch SW5 which serves to supply $+V_R$ or $-V_R$ to the common terminal, and a comparator CP6 which serves to decide the sign of the output $V_p$ of the integrator INT2. The switches SW3 and SW4 are so controlled that both the ends of the capacitor C3 are connected to the side of the integrator INT2 by a signal $P_s$ which is "0" when the integrator output $V_p$ is at a potential intermediate between $\pm V_R$, whereby the capacitor C3 is caused to contribute to the integrating operation, that while the aforementioned pulse $P_s$ of short width which becomes "1" when the integrator output $V_p$ has become $+V_R$ or $-V_R$ is "1", one end of the capacitor C3 is held at the ground potential, with the other end thereof at $-V_R$ or $+V_R$, and that as soon as the pulse $P_s$ has become "0", both the ends of the capacitor C3 are connected to the side of the integrator INT2 again, whereby the integrator is reset. The comparator CP6 serves to decide the sign of the voltage $V_p$. It throws the switch SW5 to the $-V_R$ side when the $V_p$ is plus, and to the $+V_R$ side when the $V_p$ is minus. As regards the capacitors C2 and C3, accordingly, immediately before the $V_p$ reaches $+V_R$, the charges $Q_2$ of the capacitor C2 and those $Q_3$ of the capacitor C3 are $Q_2 = C_2 \cdot V_R$ and $Q_3 = C_3 \cdot V_R$, respectively. In addition, the switch SW5 is connected to the $-V_R$ side. The instant that the $V_p$ has reached $+V_R$, the capacitor C3 is disconnected from the side of the integrator INT2 and connected to the terminals on the opposite side by the switches SW3 and SW4. As a result, one end of the capacitor C3 becomes the ground potential and the other end $-V_R$, and the capacitor C3 are charged to $Q_3 = -C_3 \cdot V_R$ again. The difference of these charges from the charges stored immediately before is $\Delta Q_3 = -2C_3 \cdot V_R$. When the capacitor C3 is connected to the side of the integrator INT2 again, the charges of the capacitors C2 and C3 are redistributed to render $V_p = (C_2 - C_3)V_R/(C_2 + C_3)$. After all, the integral output is equivalently reset by injecting the charges $\Delta Q_3$. The foregoing similarly applies to the case where the voltage $V_p$ has reached $-V_R$. More specifically, immediately before the voltage $V_p$ reaches $-V_R$, the charges are $Q_2 = -C_2 \cdot V_R$ and $Q_3 = -C_3 \cdot V_R$, and the switch SW5 is connected to the $+V_R$ side. When the $V_p$ has reached $-V_R$, the capacitor C3 is recharged to $Q_3 = C_3 \cdot V_R$. When this capacitor is connected to the integrator INT2, the integral output is reset to $V_p = -(C_2 - C_3) \cdot V_R/(C_2 + C_3)$ owing to the redistribution of the charges.

The embodiment 4 is a circuit which can realize the same function as that of the embodiment 3 by the use of the capacitors equal in number and in size. As stated before, however, Embodiment 3 undergoes the phenomenon that the voltage variation of the integral output $V_p$ at the resetting differs between the case of the change from the $+V_R$ side and the case of the change from the $-V_R$ side, on account of the unbalance of the parasitic capacitances (principally appearing between electrode surfaces and an LSI substrate) which is inevitably involved when the capacitors are implemented in an LSI. With Embodiment 4, even when the capacitances parasitic to the electrodes of both the ends of the capacitor are unbalanced, the reset potential of the voltage $V_p$ does not become unbalanced because one end of the capacitor C3 is connected to the inverting input side of the integrator INT2 and the other end to the output side at all times. Although this unbalance does not directly affect the measurement accuracy, it changes the coefficient of proportion between the integral input and the number of the integral output pulses $P_s$, or it renders the intervals of the output pulses $P_s$ unequal. In order to make them closer to their ideal conditions, accordingly, the use of Embodiment 4 is more favorable.

The features of Embodiment 4 will now be summed up in comparison with the other embodiments. First, the capacitors C2 and C3 form the integrating capacitor as their sum at the integration, so that the area as the LSI scarcely increases. Secondly, the capacitor C3 has only the charges inverted unlike that of Embodiment 3 wherein the capacitor itself is inverted, so that the unbalance due to the parasitic capacitances is not involved. Thirdly, the left end electrode of the capacitor C3 is of the zero potential at all times, and the right end electrode thereof is connected to the circuit of low impedance, so that a nearly ideal result can be obtained without any appreciable influence of the parasitic capacitances. Thus, Embodiment 4 is thought the most effective circuit.

Even when the output of the comparator CP6 in FIG. 13 is replaced with the Q output of the flip-flop FF2 in FIG. 5, there is no difference in operation.

Figure 14:
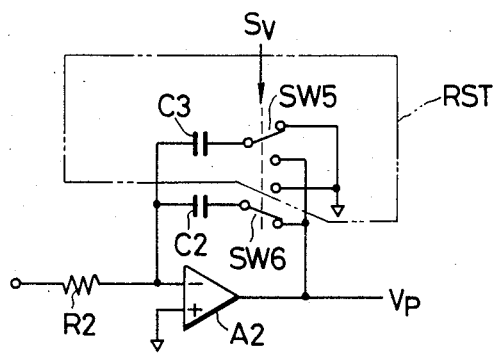
FIG. 14 shows a fifth embodiment of the reset circuit for use in the circuit arrangement of FIG. 5.

Further, the fifth embodiment is shown in FIG. 14. The present circuit is such that both capacitors C2 and C3 are connected to either the output of the amplifier A2 or a fixed potential (in general, the earth potential) through change-over switches SW5 and SW6. The change-over between the switches SW5 and SW6 is effected by the signal $S_v$. In this circuit, by way of example, while the integration is being performed by the capacitor C2 with the switch SW6 controlled to the output side of the amplifier A2, the capacitor C3 is held connected to the earth potential through the switch SW5. When the integral output $V_p$ has reached $\pm V_R$ to invert the signal $S_v$, the switches SW5 and SW6 are simultaneously changed-over by this signal, the integrating capacitor is changed-over from the C2 to the C3, and the capacitor C2 is connected to the earth potential into the reset state. Since the charges of the capacitor C3 are zero at the point of time at which the change-over has been effected, the integral output $V_p$ after the change-over starts from 0 V. Also in this case, the change-over of the switches SW5 and SW6 needs, of course, to be controlled lest the capacitors C2 and C3 should be simultaneously connected to the earth potential or the output end of the amplifier A2. To this end, a switching circuit similar to that in FIG. 11 may be used.

With the present embodiment, the integrating operation is temporarily interrupted because the capacitors C2 and C3 are simultaneously disconnected from the amplifier A2. Therefore, an error can develop in the integral output. However, the period of this floating can be set at a sufficiently short one, and the error can be made substantially negligible. Further, after starting the reset of the output $V_p$ by connecting to the amplifier A2 the capacitor C3 which has been reset to 0 volt in advance, the input voltage $V_{IG}$ fluctuates, but the integrating operation by the capacitor C3 is performed meantime. Accordingly, it is the same as in the other embodiments that the error in the period can be rendered small. The present embodiment has the advantage that, since the capacitor C3 has already been reset to 0 volt, the fluctuating period of the input voltage $V_{IG}$ for resetting the integral output can be made shorter than in the other embodiments. This system is effective as a substitute system in a case where the "on" resistance of each switch is high, so a too long time for injection is taken with the charge injecting system.

In the several embodiments thus far described, making the capacitances of the capacitors C2 and C3 substantially equal is more preferable for bringing the reset voltage $V_p$ to the vicinity of 0 V. However, even when the capacitances are somewhat different, the linearity between the electric power and the number of the pulses $P_s$ is not affected.

In the way described above, the integral value of the product between the two analog signals $E_v$ and $E_i$ can be converted into the corresponding digital signal $P_s$, UD. From the embodiments, the following is understood:

(1) In constructing a circuit which provides a digital signal corresponding to the integral value of one analog signal that can take any plus or minus value, such as the signal $E_i$, the switch SW2 may be controlled directly by the signal $S_v$. At this time, the parts relevant to the pulse width modulation and the exclusive OR gate EOR may be removed from within FIG. 5.

(2) In constructing a circuit which provides a digital signal corresponding to the integral value of the signal $E_i$ that is supposed an analog signal capable of taking only plus or only minus values, either of the inputs $\pm E_i$, the switch SW2, the flip-flop FF3 and the exclusive OR gate EORG may be removed in FIG. 5. At this time, the output of the flip-flop FF2 continues to deliver "1" when the signal $E_i$ is the plus analog signal, and it continues to deliver "0" when the signal $E_i$ is the minus analog signal. It is held true, however, that the output of the flip-flop FF2 indicates the direction of the increase or decrease of the integral value of the analog signal.

As set forth above, at the point of time at which it has been detected that an integrator output has reached a predetermined voltage, charges are injected into an integrator circuit, or a capacitor is changed-over to a capacitor having been reset in advance, whereby a precise digital output corresponding to the integral value of an analog signal can be obtained.

What is claimed is:

1. An integrator circuit comprising:
an operational amplifier;
an integrating capacitor which is disposed between an input terminal and an output terminal of said operational amplifier; and
means for resetting charges of said integrating capacitor in response to a control pulse in a state in which said integrating capacitor is connected to said operational amplifier for, at least, a period from start to end of the resetting, including a resetting capacitor in which charges opposite in polarity to said charges of said integrating capacitor are stored before the control pulse is generated and means for connecting said resetting capacitor to said integrating capacitor in response to the control pulse.

2. An integrator circuit comprising:
an operational amplifier;
an integrating capacitor which is disposed between an input terminal and an output terminal of said operational amplifier; and
means for resetting charges of said integrating capacitor in response to a control pulse in a state in which said integrating capacitor is connected to said operational amplifier for, at least, a period from start to end of the resetting, wherein said integrating capacitor comprises first and second capacitors which are connected in parallel with each other, and said resetting means comprises means for changing a sense of said second capacitor and connecting this capacitor in parallel with said first capacitor in response to the control pulse.

3. An integrator circuit comprising:
an operational amplifier;
an integrating capacitor which is disposed between an input terminal and an output terminal of said operational amplifier; and
means for resetting charges of said integrating capacitor in response to a control pulse in a state in which said integrating capacitor is connected to said operational amplifier for, at least, a period from start to end of the resetting, wherein said integrating capacitor comprises first and second capacitors which are connected in parallel with each other, and said resetting means comprises means responding to the control pulse to disconnect said second capacitor from said first capacitor, to store said second capacitor with charges opposite in polarity to stored charges of said first capacitor and to thereafter connect said second capacitor in parallel with said first capacitor.

4. An integrator circuit comprising:
an operational amplifier;
an integrating capacitor which is disposed between an input terminal and an output terminal of said operational amplifier; and
means for resetting charges of said integrating capacitor in response to a control pulse in a state in which said integrating capacitor is connected to said operational amplifier for, at least, a period from start to end of the resetting, wherein said integrating capacitor comprises either of first and second capacitors, and said resetting means comprises means for changing-over connections in response to the control pulse so as to connect one of said first and second capacitors between said input terminal and said output terminal of said operational amplifier as said integrating capacitor and to connect the other of said first and second capacitors to a power source for resetting.

5. An analog signal integrating and pulse-converting circuit comprising:
integration means for integrating a first analog signal;
means for detecting coincidence of the integral output of said integration means with a plus reference value or a minus reference value;
means for delivering a pulse each time the either coincidence is detected;
means for resetting the integrator circuit each time the either coincidence is detected; and
means responding to the detection output to generate a signal which discriminates whether the detection of the coincidence results from increase or decrease in the integral value of the analog signal;
said integration means comprising:
an operational amplifier;
an integrating capacitor which is disposed between an input terminal and an output terminal of said operational amplifier; and
means for resetting charges of said integrating capacitor in response to a control pulse in a state in which said integrating capacitor is connected to said operational amplifier for, at least, a period from start to end of the resetting.

6. An analog signal integrating and pulse-converting circuit according to claim 5, further comprising:
selection means for selecting either of the first analog signal and an inverted signal of this first analog signal and making it an integral input; and
means responding to the detection of the either coincidence to generate a signal which controls said selection means;
the discriminative signal generating means comprising means for delivering the discriminative signal in response to the detection output and the selected state of said selection means.

7. An analog signal integrating and pulse-converting circuit according to claim 6, wherein the control signal generating means comprises:
means for changing-over first and second values and delivering either thereof each time the either coincidence is detected; and
means for generating pulse-width-modulated pulses corresponding to amplitudes and polarities of a second analog signal and an inverted signal thereof when the delivered outputs of the output means are the first and second values, respectively, to control said selection means with the pulse-width-modulated pulse.

* * * * *